(12) United States Patent
Zaima et al.

(10) Patent No.: US 11,817,476 B2
(45) Date of Patent: Nov. 14, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kotaro Zaima, Nomi Ishikawa (JP); Yukie Nishikawa, Nonoichi Ishikawa (JP); Emiko Adachi, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/184,510

(22) Filed: Feb. 24, 2021

(65) Prior Publication Data

US 2022/0059649 A1   Feb. 24, 2022

(30) Foreign Application Priority Data

Aug. 19, 2020   (JP) ................ 2020-138686

(51) Int. Cl.
*H01L 29/06* (2006.01)
*H01L 29/423* (2006.01)
*H01L 29/417* (2006.01)

(52) U.S. Cl.
CPC .... *H01L 29/0607* (2013.01); *H01L 29/41708* (2013.01); *H01L 29/42304* (2013.01)

(58) Field of Classification Search
None
See application file for complete search history.

(56) References Cited

U.S. PATENT DOCUMENTS

| | | | |
|---|---|---|---|
| 9,601,639 B2 | 3/2017 | Masuoka et al. | |
| 10,128,230 B2 | 11/2018 | Shirakawa et al. | |
| 10,381,467 B2 | 8/2019 | Baburske et al. | |
| 2014/0097431 A1* | 4/2014 | Zundel | H01L 29/7813 257/48 |
| 2014/0097863 A1* | 4/2014 | Zundel | G01R 31/2601 324/762.01 |
| 2016/0190123 A1* | 6/2016 | Laven | H01L 29/1095 257/140 |
| 2019/0006495 A1* | 1/2019 | Ogura | H01L 29/0619 |
| 2019/0081173 A1* | 3/2019 | Nishiwaki | H01L 29/7397 |

FOREIGN PATENT DOCUMENTS

| JP | 2007-529115 A | 10/2007 |
|---|---|---|
| JP | 2017-147431 A | 8/2017 |

* cited by examiner

*Primary Examiner* — Khaja Ahmad
(74) *Attorney, Agent, or Firm* — Kim & Stewart LLP

(57) ABSTRACT

A semiconductor device includes a semiconductor layer having a first surface in which a plurality of trenches each extending along a first direction are arranged along a second direction perpendicular to the first direction, a first electrode on a second surface of the semiconductor layer, a second electrode on the first surface of the semiconductor layer, and a control electrode inside at least one of the trenches. The plurality of trenches includes first, second, and third trenches. The first and second trenches are connected to each other via a first connector at an end in the first direction of each of the first and second trenches. The third trench extends beyond the end of each of the first and second trenches along the first direction.

14 Claims, 14 Drawing Sheets

SEMICONDUCTOR DEVICE

CROSS-REFERENCE TO RELATED APPLICATION(S)

This application is based upon and claims the benefit of priority from Japanese Patent Application No. 2020-138686, filed on Aug. 19, 2020, the entire contents of which are incorporated herein by reference.

FIELD

Embodiments described herein relate generally to a semiconductor device.

BACKGROUND

Semiconductor devices for power control are required to have a high withstand voltage and low ON resistance.

DETAILED DESCRIPTION

Figure 1A:
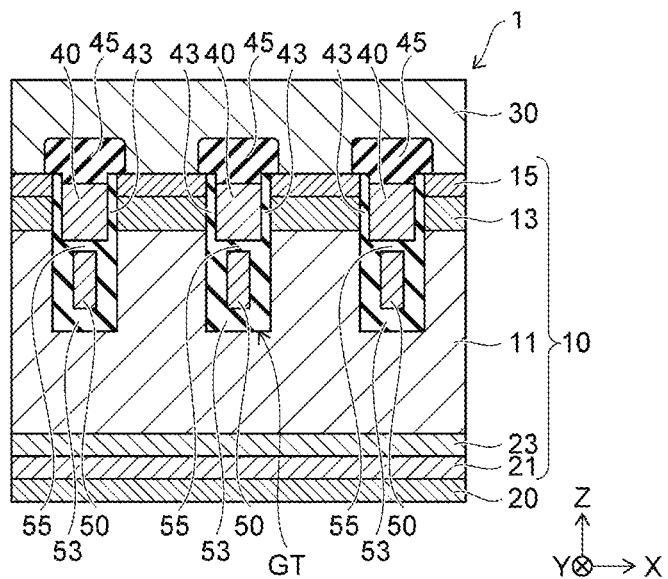
FIG. 1A and FIG. 1B are schematic views illustrating a semiconductor device according to an embodiment.

Embodiments provide a semiconductor device with a high withstand voltage and low ON resistance.

In general, according to one embodiment, a semiconductor device includes a semiconductor layer having a first surface in which a plurality of trenches each extending along a first direction are arranged along a second direction perpendicular to the first direction, a first electrode on a second surface of the semiconductor layer, a second electrode on the first surface of the semiconductor layer, and a control electrode inside at least one of the trenches. The plurality of trenches includes first, second, and third trenches. The first and second trenches are connected to each other via a first connector at an end in the first direction of each of the first and second trenches. The third trench extends beyond the end of each of the first and second trenches along the first direction.

Hereinafter, embodiments will be described with reference to the drawings. The same parts in the drawings will be designated by the same reference numerals, and additional description thereof will be omitted as appropriate. The drawings are schematic or conceptual, and a relationship between the thickness and width of each part and the ratio of sizes between the parts are not necessarily the same as the actual ones. Further, even when the same parts are represented, those dimensions or scales may be different from each other depending on the drawings.

Furthermore, the arrangement and configuration of each part will be described using the X axis, the Y axis, and the Z axis illustrated in each drawing. The X axis, the Y axis, and the Z axis are orthogonal to each other and represent the X direction, the Y direction, and the Z direction, respectively. Further, the one Z direction along the Z axis may be described as upward or the like, and the opposite direction may be described as downward or like.

Figure 1B:
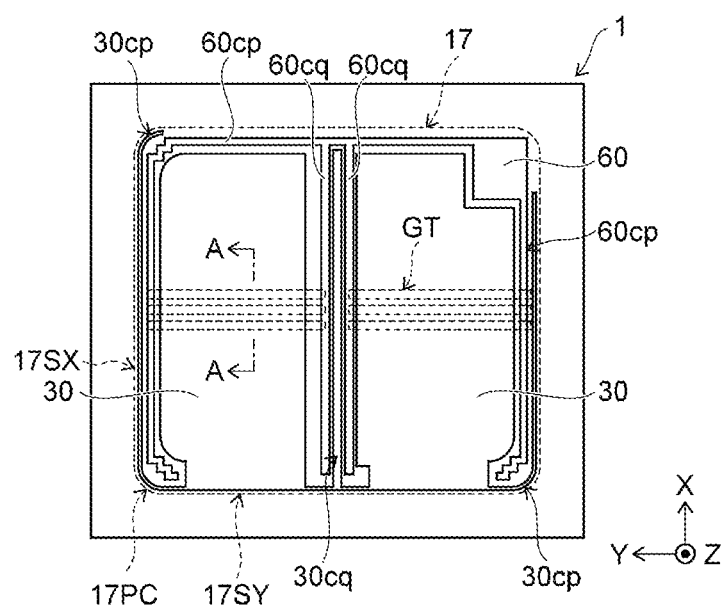

FIGS. 1A and 1B are schematic views illustrating a semiconductor device 1 according to an embodiment. FIG. 1A is a cross-sectional view of the semiconductor device 1. FIG. 1B is a plan view illustrating the upper surface of the semiconductor device 1. The semiconductor device 1 is, for example, an insulated gate bipolar transistor (IGBT). The semiconductor device 1 may be any type of transistor. For example, the semiconductor device 1 may be a metal oxide semiconductor field effect transistor (MOSFET).

As illustrated in FIG. 1A, the semiconductor device 1 includes a semiconductor unit or layer 10, a first electrode 20, a second electrode 30, a plurality of control electrodes 40, and a plurality of third electrodes 50. The semiconductor unit 10 is, for example, silicon.

The first electrode 20 is provided on the back or lower side of the semiconductor unit 10. The first electrode 20 is, for example, a collector, and is a metal layer containing titanium, nickel, silver, or the like.

The second electrode 30 is provided on the front or upper side of the semiconductor unit 10. The second electrode 30 is, for example, an emitter, and is a metal layer containing tungsten, aluminum, or the like.

The control electrode 40 and the third electrode 50 are provided inside a trench GT provided in the upper side of the semiconductor unit 10. A plurality of trenches GT is provided, and is arranged side by side in a direction along the surface of the semiconductor unit 10 (the X direction in this example). The control electrode 40 is provided between the second electrode 30 and the third electrode 50. The control electrode 40 and the third electrode 50 are, for example, polysilicon having conductivity.

The control electrode 40 is electrically insulated from the semiconductor unit 10 by an insulating film 43. Further, the control electrode 40 is electrically insulated from the second electrode 30 by an insulating film 45. The third electrode 50 is electrically insulated from the semiconductor unit 10 by an insulating film 53. Further, the third electrode 50 is electrically insulated from the control electrode 40 by an insulating film 55.

Figure 7A:
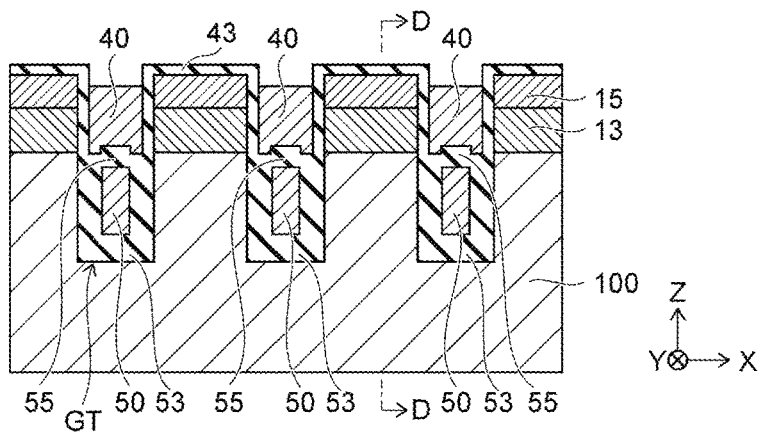
FIG. 7A to FIG. 7C are schematic views illustrating a manufacturing process.
Figure 7B:
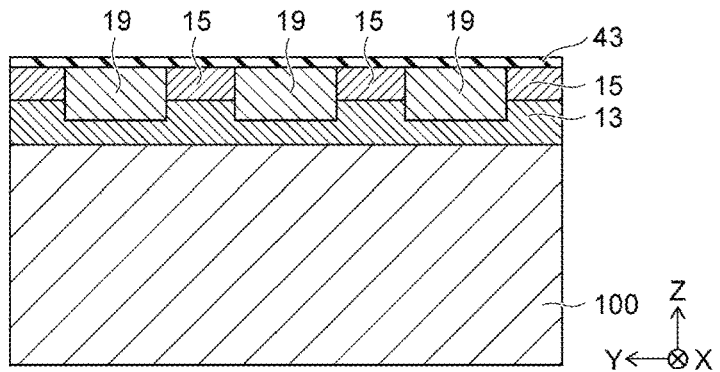

The semiconductor unit 10 includes, for example, a first conductivity type first semiconductor layer 11, a second conductivity type second semiconductor layer 13, a first conductivity type third semiconductor layer 15, a second conductivity type fourth semiconductor layer 17 (see FIG. 1B), a second conductivity type fifth semiconductor layer 21, a first conductivity type sixth semiconductor layer 23, and a seventh semiconductor layer 19 (see FIG. 7B). Hereinafter, the first conductivity type will be described as an n-type, and the second conductivity type will be described as a p-type.

The first semiconductor layer 11 is, for example, an n-type base layer, and extends between the first electrode 20 and the second electrode 30. Further, the first semiconductor layer 11 extends between two adjacent trenches GT among the plurality of trenches GT.

The second semiconductor layer 13 is provided between the first semiconductor layer 11 and the second electrode 30. The second semiconductor layer 13 is, for example, a p-type base layer. The second semiconductor layer 13 is provided between the adjacent trenches GT so as to face the control electrode 40 across the insulating film 43.

The third semiconductor layer 15 is provided between the second semiconductor layer 13 and the second electrode 30, and is electrically connected to the second electrode 30. The third semiconductor layer 15 is, for example, an n-type emitter layer. The third semiconductor layer 15 is provided between the adjacent trenches GT so as to be in contact with the insulating film 43.

Figure 3A:
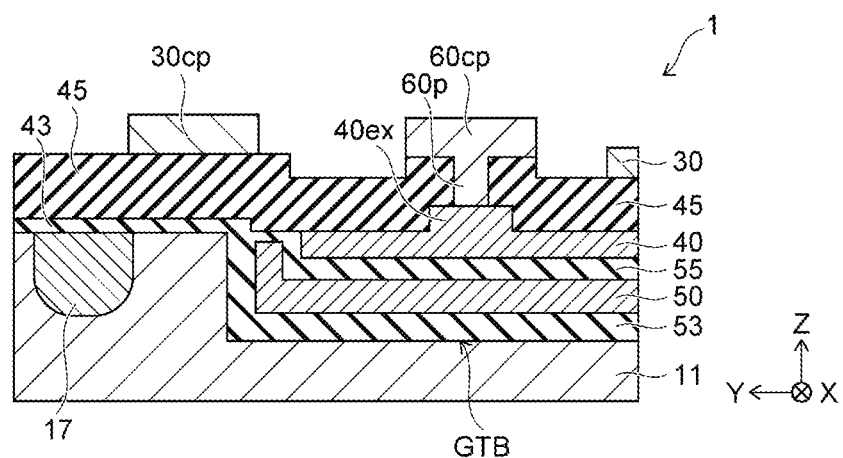
FIG. 3A and FIG. 3B are schematic cross-sectional views illustrating a semiconductor device according to an embodiment.
Figure 3B:
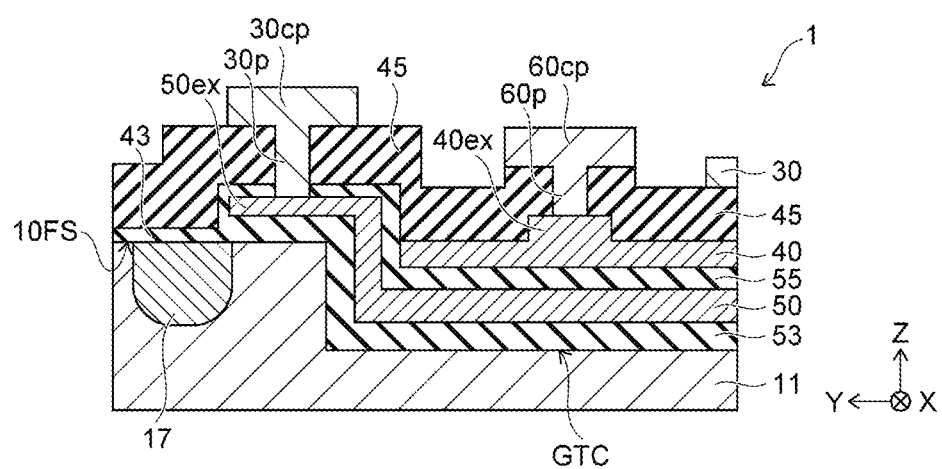

As shown in FIGS. 1B, 3A, and 3B, the fourth semiconductor layer 17 extends along the surface of the semiconductor unit 10, and surrounds the second semiconductor layer 13, the third semiconductor layer 15, and the trench GT. The fourth semiconductor layer 17 is, for example, a p-type guard ring.

The fifth semiconductor layer 21 is provided between the first semiconductor layer 11 and the first electrode 20. The fifth semiconductor layer 21 is, for example, a p-type collector layer. The fifth semiconductor layer 21 is electrically connected to the first electrode 20.

The sixth semiconductor layer 23 is provided between the first semiconductor layer 11 and the fifth semiconductor layer 21. The sixth semiconductor layer 23 is, for example, an n-type buffer layer. The sixth semiconductor layer 23 contains an n-type impurity (dopant) at a higher concentration than that of an n-type impurity (dopant) in the first semiconductor layer 11.

As illustrated in FIG. 1B, the second electrode 30, first wirings 30cp and 30cq, a control pad 60, and second wirings 60cp and 60cq are provided on the semiconductor unit 10.

For example, the second electrode 30 covers the third semiconductor layer 15. In this example, two second electrodes 30 are arranged side by side in the Y direction. The trench GT is provided below the second electrode 30, and extends in the Y direction. The plurality of trenches GT are arranged side by side in the X direction. In FIG. 1B, for simplicity, some of the plurality of trenches GT are illustrated, and the others are omitted.

The first wirings 30cp each extend along the outer edge of the second electrode 30 in the X direction. A part of the first wiring 30cp extending along the X direction does not contact the second electrode 30, but the end of the first wiring 30cp is connected to the second electrode 30.

The other first wiring 30cq is provided between the two second electrodes 30. The first wiring 30cq extends in the X direction. The first wirings 30cp and 30cq are electrically connected to at least one of the two second electrodes 30.

The second wiring 60cp is provided along the outer circumference of the two second electrodes 30, and includes a portion extending between the first wiring 30cp and the second electrode 30. The second wiring 60cp is connected to the control pad 60. The second wiring 60cp is electrically connected to the control pad 60.

The other second wiring 60cq is provided between the two second electrodes 30, and extends in the X direction. The second wiring 60cq extends between the first wiring 30cq and the second electrode 30. For example, the second wiring 60cq is connected to the second wiring 60cp, and is electrically connected to the control pad 60 via a part of the second wiring 60cp.

The outer edge of the fourth semiconductor layer 17 illustrated by the broken line in FIG. 1B includes, for example, a first side 17SX intersecting the direction in which the trench GT extends (i.e., the Y direction), a second side 17SY extending in the direction in which the trench GT extends, and a corner 17PC interconnecting the first side 17SX and the second side 17SY. The corner 17PC is provided in an arc shape having a predetermined radius of curvature. Thus, the concentration of an electric field on the outer edge of the fourth semiconductor layer 17 may be relieved, and the OFF withstand voltage of the semiconductor device 1 may be improved.

Figure 2A:
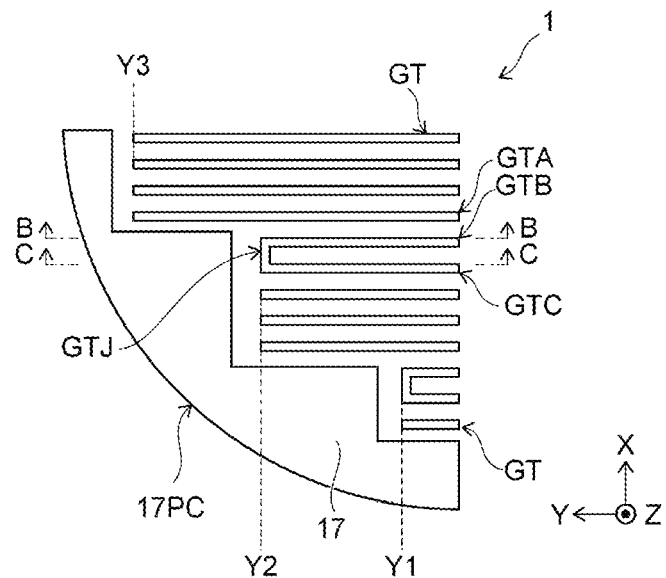
FIG. 2A and FIG. 2B are schematic plan views illustrating a semiconductor device according to an embodiment.
Figure 2B:
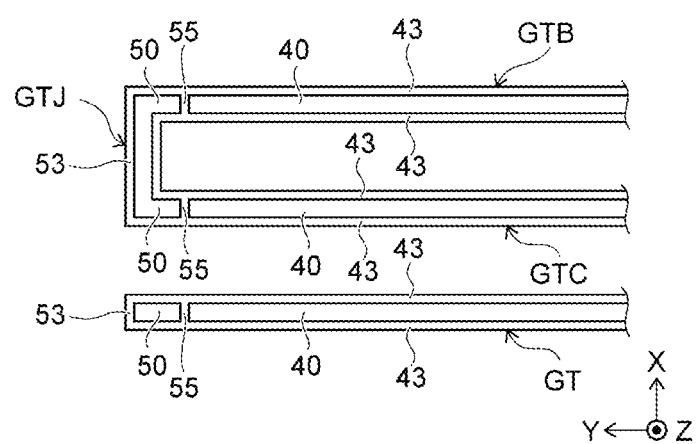

FIGS. 2A and 2B are schematic plan views illustrating the semiconductor device 1 according to an embodiment. FIG. 2A is a plan view illustrating the trenches GT provided in an area of the fourth semiconductor layer 17 close to the corner 17PC. FIG. 2B is a plan view illustrating the control electrodes 40 and the third electrodes 50 provided inside trenches GT, GTB and GTC illustrated in FIG. 2A.

As illustrated in FIG. 2A, a plurality of trenches GT having end portions located at different positions in the Y direction are provided along the outer edge of the corner 17PC of the fourth semiconductor layer 17. That is, in FIG. 2A, a first group of the trenches GT each having an end at a first position Y1, a second group of the trenches GT each having an end at a second position Y2, and a third group of the trenches GT each having an end at a third position Y3 are arranged in sequence in the X direction. The distance along the Y direction from the second position Y2 to the outer edge of the corner 17PC is shorter than the distance along the Y direction from the first position Y1 to the outer edge of the corner 17PC. Further, the distance along the Y direction from the third position Y3 to the outer edge of the corner 17PC is shorter than the distance along the Y direction from the second position Y2 to the outer edge of the corner 17PC.

With such an arrangement of the trenches GT, the second semiconductor layer 13 provided between adjacent trenches GT may expand in the Y direction. Therefore, an inversion layer induced between the second semiconductor layer 13 and the insulating film 43 by the control electrode 40 may be widened. That is, the channel width of the semiconductor device 1 may be increased and the ON resistance of the semiconductor device 1 may be reduced.

In an example illustrated in FIG. 2A, a trench GTA among the trenches GT of the third group having the Y directional end at the third position Y3 is adjacent to a trench GTB among the trenches GT of the second group having the Y directional end at the second position Y2. Among the trenches GT of the second group, the trench GTB and a trench GTC are arranged adjacent to each other, and are connected to each other at the Y directional ends thereof. Further, among the trenches GT of the first group having the Y directional end at the first position Y1, two trenches GT adjacent to the trenches GT of the second group are connected to each other at the Y directional ends thereof.

As illustrated in FIG. 2B, the control electrode 40 is provided inside each trench GT. A part of the third electrode 50 is provided between the Y directional end of each trench GT and the control electrode 40.

As illustrated in FIG. 2B, the trench GTB and the trench GTC are connected to each other at the Y directional ends thereof via a connector GTJ. The respective third electrodes 50 provided in the trench GTB and the trench GTC are connected to each other via the connector GTJ.

FIGS. 3A and 3B are schematic cross-sectional views illustrating the semiconductor device 1 according to an embodiment. FIG. 3A is a cross-sectional view taken along line B-B in FIG. 2A. FIG. 3B is a cross-sectional view taken along line C-C in FIG. 2A.

As illustrated in FIG. 3A, the control electrode 40 and the third electrode 50 extend in the Y direction inside the trench GTB. The control electrode 40 is provided over the third electrode 50. The third electrode 50 has a portion located in the connector GTJ at the Y directional end thereof. The third electrode 50 is elongated upward (i.e., the Z direction) in the connector GTJ.

The control electrode 40 has a contact part 40ex. For example, the contact part 40ex extends in the X direction along the surface of the semiconductor unit 10, and is shared by a plurality of control electrodes 40 arranged side by side in the X direction (see FIG. 11B).

The second wiring 60cp is provided above the contact part 40ex. The second wiring 60cp has a contact plug 60p elongated through the insulating film 45. The contact plug 60p is connected to the contact part 40ex. That is, the control electrode 40 is electrically connected to the second wiring 60cp via the contact part 40ex and the contact plug 60p.

As illustrated in FIG. 3B, the control electrode 40 and the third electrode 50 extend in the Y direction inside the trench GTC. The control electrode 40 is provided over the third electrode 50. The control electrode 40 is electrically connected to the second wiring 60cp via the contact part 40ex and the contact plug 60p.

The third electrode 50 is elongated upward (i.e., the Z direction) at the Y directional end thereof. Furthermore, the third electrode 50 is connected to a contact part 50ex extending from the end of the trench GTC along the surface of the semiconductor unit 10. The contact part 50ex is electrically connected to the third electrodes 50 provided inside the plurality of trenches GT arranged side by side in the X direction.

The first wiring 30cp is provided above the contact part 50ex. The first wiring 30cp has a contact plug 30p elongated in the Z direction through the insulating film 45 and the insulating film 55. The contact plug 30p is connected to the contact part 50ex. That is, the third electrode 50 is electrically connected to the first wiring 30cp via the contact part 50ex and the contact plug 30p.

As illustrated in FIG. 3A, the third electrode 50 provided inside the trench GTB is not connected to the contact part 50ex, but is electrically connected to the third electrode 50 in the trench GTC via the connector GTJ. That is, the third electrode in the trench GTB is electrically connected to the first wiring 30cp via the third electrode 50 in the trench GTC.

Next, a method of manufacturing the semiconductor device 1 according to an embodiment will be described with reference to FIGS. 4A to 7B. FIGS. 4A to 7B are schematic views illustrating a manufacturing process of the semiconductor device 1.

Figure 4A:
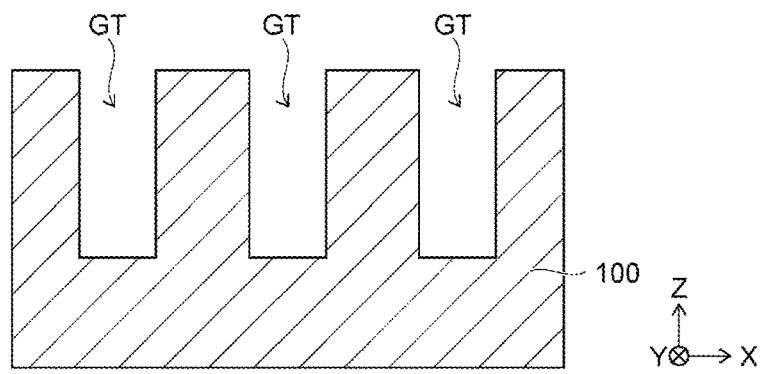
FIG. 4A to FIG. 4C are schematic views illustrating a manufacturing process of a semiconductor device according to an embodiment.
Figure 4B:
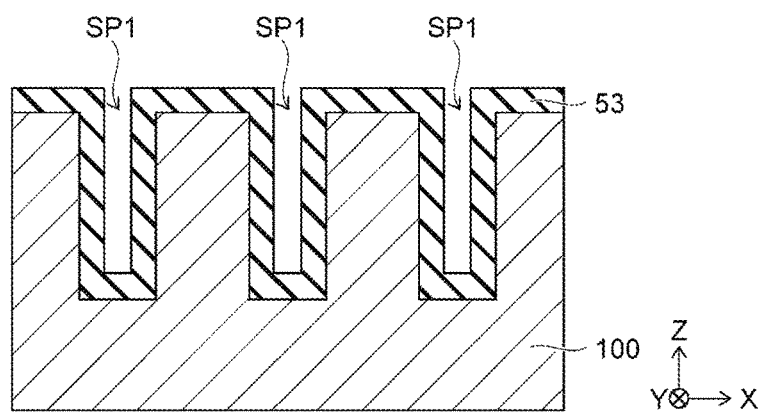
Figure 4C:
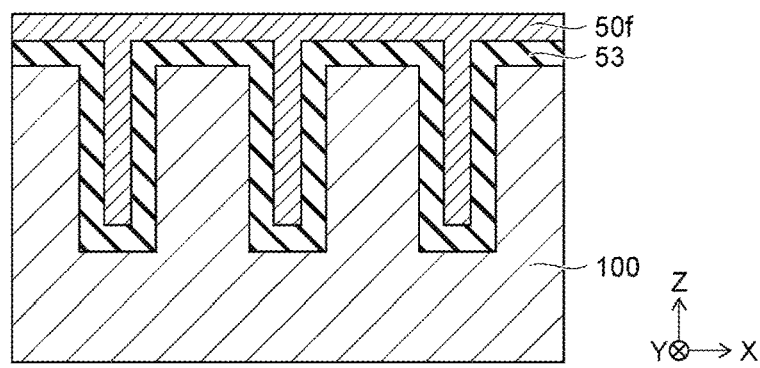
Figure 5A:
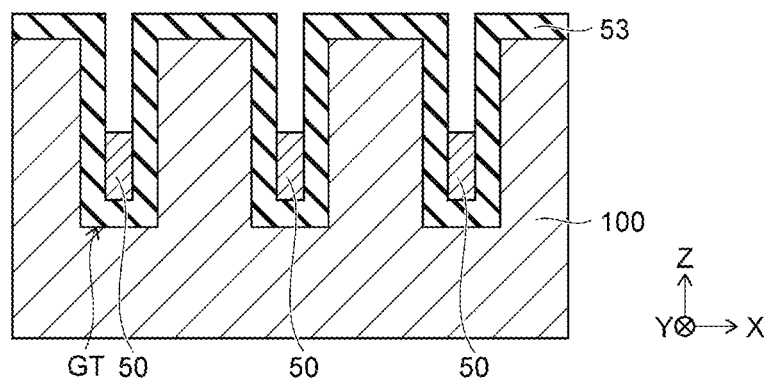
FIG. 5A and FIG. 5B are schematic views illustrating a manufacturing process.
Figure 5B:
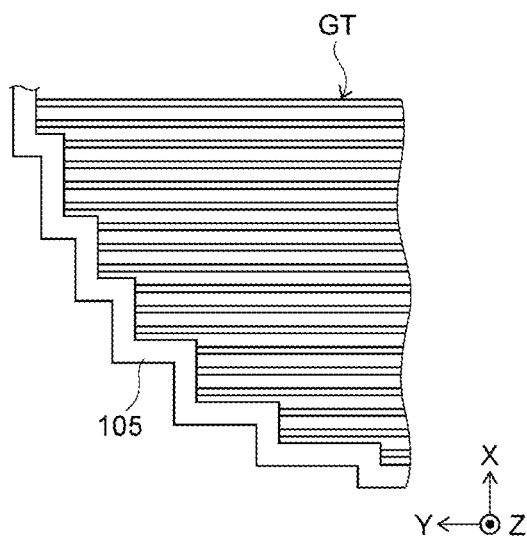

FIGS. 4A to 7B are schematic cross-sectional views illustrating the cross section of a semiconductor wafer 100, except for FIG. 5B. FIG. 5B is a plan view illustrating the front or upper side of the semiconductor wafer 100. The semiconductor wafer 100 is, for example, an n-type silicon wafer, and contains an n-type impurity at the same concentration as that of the n-type impurity in the first semiconductor layer 11.

As illustrated in FIG. 4A, the trench GT is formed in the front side of the semiconductor wafer 100. For example, the trench GT is formed by selectively etching the semiconductor wafer 100 using an etching mask (not illustrated). The trench GT is formed by, for example, anisotropic reactive ion etching (RIE).

As illustrated in FIG. 4B, the insulating film 53 covers the surface of the semiconductor wafer 100 and the inner surface of the trench GT. The insulating film 53 is formed, for example, by thermally oxidizing the semiconductor wafer 100. The insulating film 53 is formed to leave a space SP1 inside the trench GT.

As illustrated in FIG. 4C, a conductive layer 50f is formed on the insulating film 53. The conductive layer 50f covers the surface of the semiconductor wafer 100 and to fill the space SP1 in the trench GT. The conductive layer 50f is, for example, a polysilicon layer, and is formed by using chemical vapor deposition (CVD).

As illustrated in FIG. 5A, the third electrode 50 is formed in the lower region of the trench GT. The third electrode 50 is electrically insulated from the semiconductor wafer 100 by the insulating film 53. The third electrode 50 is formed, for example, by selectively removing the conductive layer 50f to leave a portion thereof provided in the lower region of the trench GT by chemical dry etching (CDE).

The conductive layer 50f is selectively removed by using an etching mask 105 illustrated in FIG. 5B. The etching mask 105 covers the Y directional end of the trench GT. That is, the etching mask 105 covers a portion that is to be the contact part 50ex (see FIG. 3B).

Figure 6A:
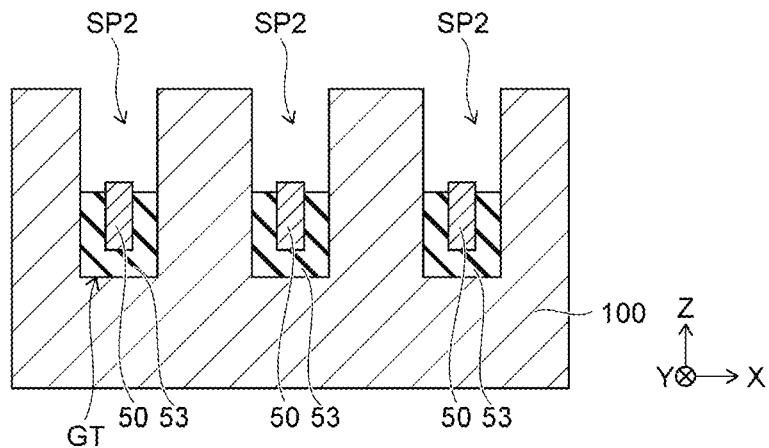
FIG. 6A to FIG. 6C are schematic views illustrating a manufacturing process.

As illustrated in FIG. 6A, the insulating film 53 is selectively removed, so that a space SP2 is created in the upper region of the trench GT. A portion of the insulating film 53 formed on the surface of the semiconductor wafer 100 is also removed to leave a portion covered with the contact part 50ex.

Figure 6B:
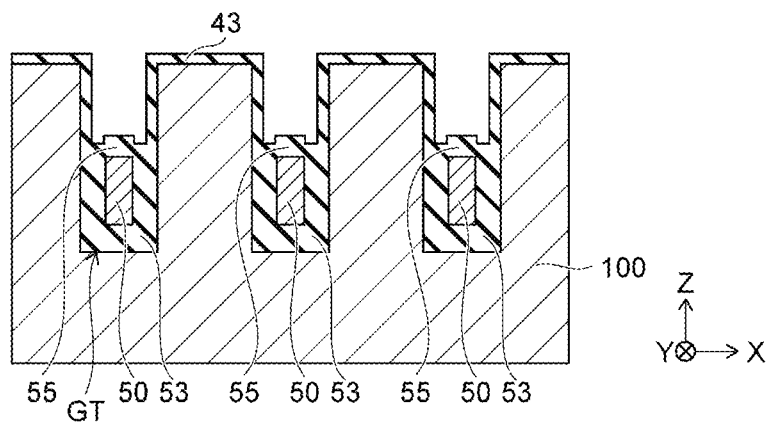

As illustrated in FIG. 6B, the insulating film 43 is formed on the surface of the semiconductor wafer 100 and a portion of the semiconductor wafer 100 exposed in the space SP2. The insulating film 55 is also formed on the third electrode 50 at the same time.

The insulating film 43 is formed, for example, by thermally oxidizing the semiconductor wafer 100. The film thickness of the insulating film 43 is less than the insulating film 53. The insulating film 43 is, for example, a silicon oxide film. The insulating film 55 is formed, for example, by thermally oxidizing the upper end of the third electrode 50 exposed to the space SP2. The insulating film 55 is, for example, a silicon oxide film.

Figure 6C:
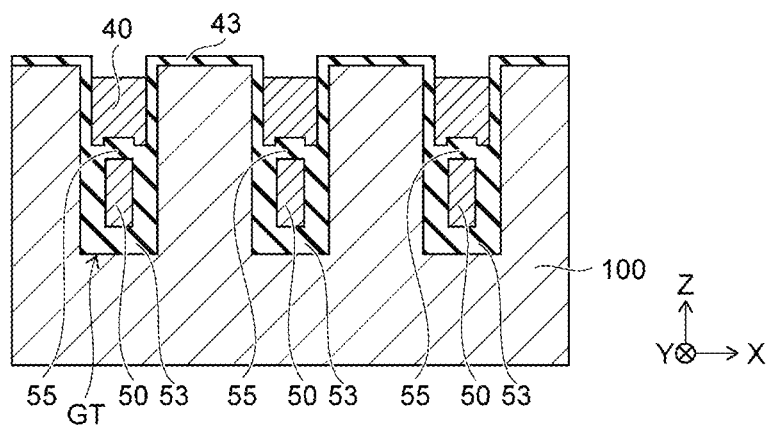

As illustrated in FIG. 6C, the control electrode 40 is formed inside the space SP2. The control electrode 40 is formed, for example, by selectively removing a polysilicon film provided on the insulating film 43 to leave a portion thereof embedded in the space SP2.

As illustrated in FIG. 7A, the second semiconductor layer 13 and the third semiconductor layer 15 are formed on the front side of the semiconductor wafer 100. The second semiconductor layer 13 faces the control electrode 40 via the insulating film 43. The third semiconductor layer 15 is formed on the second semiconductor layer 13 so as to be in contact with the insulating film 43.

The second semiconductor layer 13 is formed, for example, by ion-implanting boron, which is a p-type impurity (dopant), and activating and diffusing the p-type impurity by heat treatment. The third semiconductor layer 15 is formed, for example, by ion-implanting phosphorus, which is an n-type impurity, and activating the n-type impurity by heat treatment.

As illustrated in FIG. 7B, the seventh semiconductor layer 19 is selectively formed on the front side of the semiconductor wafer 100. FIG. 7B is a cross-sectional view taken along line D-D illustrated in FIG. 7A. The seventh semiconductor layer 19 is provided between the adjacent trenches GT, and is arranged alternately with the third semiconductor layer 15 in the Y direction.

The seventh semiconductor layer 19 is formed, for example, by ion-implanting boron, which is a p-type impurity, and activating the p-type impurity by heat treatment. The seventh semiconductor layer 19 has a depth ranging from the surface of the semiconductor unit 10 to the second semiconductor layer 13, and contains a p-type impurity having a higher concentration than that of the p-type impurity of the second semiconductor layer 13.

Figure 7C:
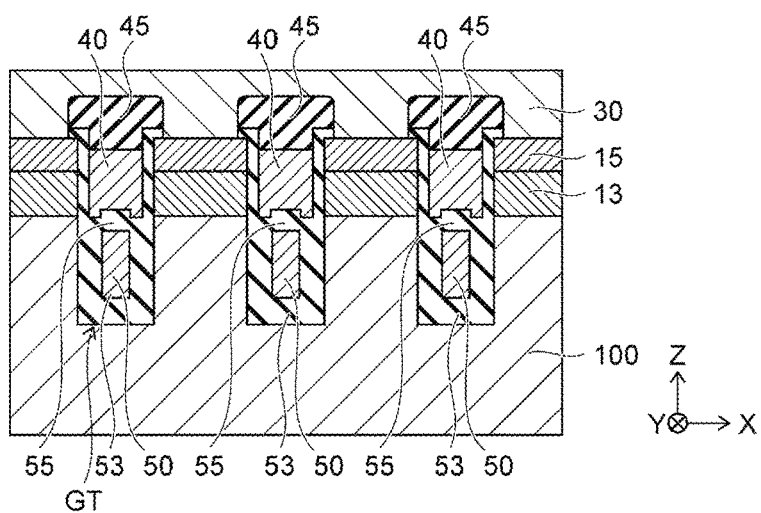

As illustrated in FIG. 7C, after the insulating film 45 is formed on the control electrode 40, the second electrode 30 is formed. For example, after the insulating film 45 is formed on the surface side of the semiconductor wafer 100 to cover the control electrode 40 and the insulating film 43 (see FIG. 7A), the insulating film 45 and the insulating film 43 are selectively removed so as to expose the third semiconductor layer 15 and the seventh semiconductor layer 19. After that, the second electrode 30 is formed to be in contact with the third semiconductor layer and the seventh semiconductor layer 19 and to cover the insulating film 45.

The second electrode 30 is formed to be in contact with the third semiconductor layer 15 and the seventh semiconductor layer 19. The second electrode 30 is electrically connected to the third semiconductor layer 15 and is also electrically connected to the second semiconductor layer 13 via the seventh semiconductor layer 19.

The first wirings $30cp$ and $30cq$, the second wirings $60cp$ and $60cq$, and the control pad 60 are formed, for example, on the insulating film 45 at the same time with the second electrode 30. The first wiring $30cp$ and $30cq$, the second wirings $60cp$ and $60cq$, and the control pad 60 are electrically insulated from the semiconductor unit 10 by the insulating films 43 and 45.

Further, the semiconductor wafer 100 is thinned to a predetermined thickness by grinding or etching the back side of the semiconductor wafer 100. After that, the fifth semiconductor layer 21 and the sixth semiconductor layer 23 are formed on the back side of the semiconductor wafer 100 by using, for example, ion implantation. Subsequently, the first electrode 20 is formed on the back side of the semiconductor wafer 100 to complete the semiconductor device 1.

Figure 8A:
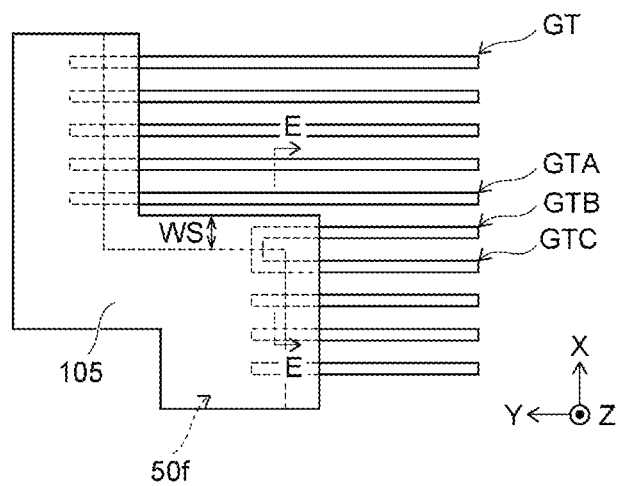
FIG. 8A and FIG. 8B are schematic views illustrating a manufacturing process of a semiconductor device according to an embodiment.
Figure 8B:
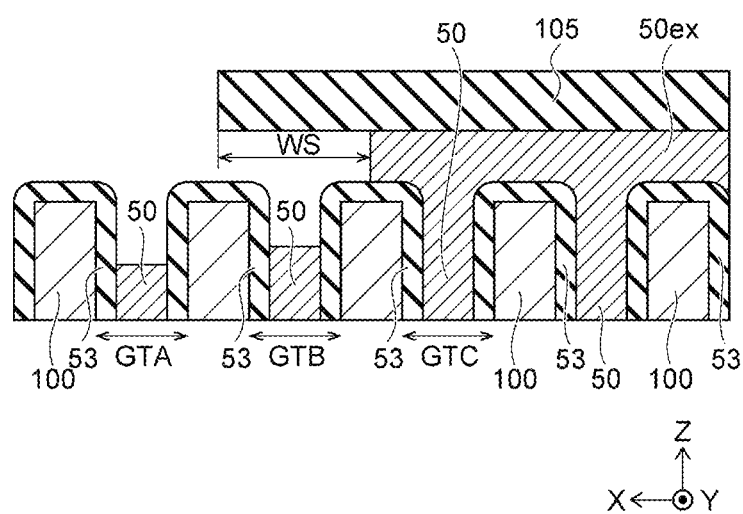

FIGS. 8A and 8B are schematic views illustrating a part of the manufacturing process of the semiconductor device 1 according to an embodiment. FIG. 8A is a partial plan view illustrating the front side of the semiconductor wafer 100. FIG. 8B is a cross-sectional view taken along line E-E illustrated in FIG. 8A.

FIGS. 8A and 8B illustrate a process of selectively etching the conductive layer $50f$ using the etching mask 105 (see FIGS. 5A and 5B). For example, when the conductive layer $50f$ is selectively removed by CDE, etching progresses isotropically by the etching gas introduced between the etching mask 105 and the semiconductor wafer 100, causing side etching.

As illustrated in FIG. 8B, side etching progresses inward from the outer edge of the etching mask 105, so that the contact part $50ex$ is reduced. At this time, for example, when the amount of side etching WS is equal to the gap between the trenches GT arranged side by side in the X direction, or is greater than the gap of the trenches GT, the third electrode 50 in the trench GTB close to the outer edge of the etching mask 105 is not connected to the contact part $50ex$ (see FIG. 3A).

By forming the connector GTJ connecting the adjacent trenches GTB and GTC to each other, the third electrodes 50 provided in the respective trenches GTB and GTC are connected to each other (see FIG. 2B). Therefore, the third electrode 50 provided in the trench GTB is connected to the first wiring $30cp$ via the third electrode 50 provided in the trench GTC. Thus, the potential of the third electrode 50 in the trench GTB may be stabilized, and the characteristics of the semiconductor device 1 may be improved.

As described above, the semiconductor device 1 has the third electrodes 50 below the control electrodes 40 in the trenches GT, which are subject to side etching in the manufacturing process shown in FIGS. 8A and 8B, causing the third electrode 50 in the trench (e.g., GTB) along an edge of the etching mask to be disconnected from the other electrode 50 in the adjacent trench (e.g., GTC). This situation may occur when the semiconductor device 1 has no third electrodes 50 below the control electrodes 40. In such a case, the control electrodes 40 are subject to side etching as shown in FIG. 8A, and the electrode 40 in the trench along the edge of the etching mask to be disconnected from the adjacent electrode 40. This issue can also be solved by providing the connector GTJ between the adjacent trenches so that the electrodes 40 in the two trenches are electrically connected via the connector. That is, the embodiments described in this disclosure are applicable to semiconductor devices not having the electrodes 50 below the control electrodes 40 in the trenches GT.

Figure 9A:
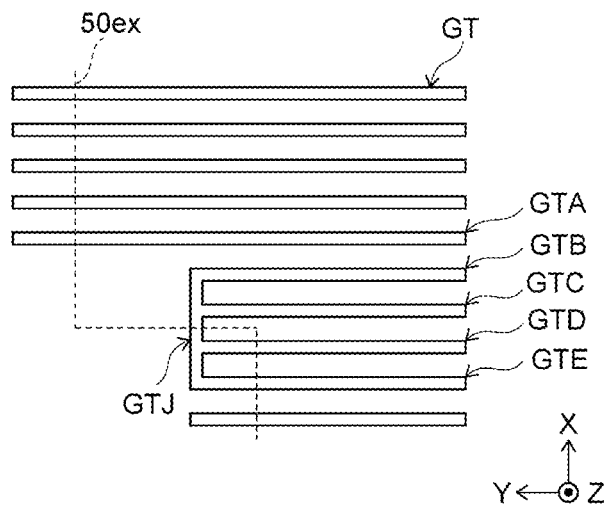
FIG. 9A and FIG. 9B are schematic views illustrating a semiconductor device according to an embodiment.
Figure 9B:
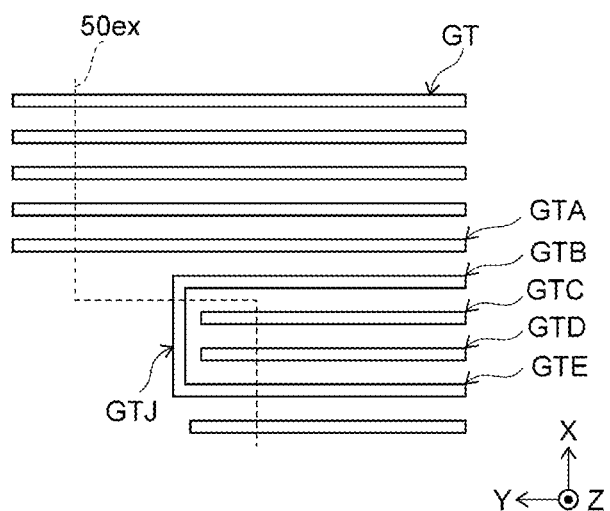

FIGS. 9A and 9B are schematic views illustrating the semiconductor device 1 according to an embodiment. FIGS. 9A and 9B are partial plan views illustrating the arrangements of the trenches GT.

In an example illustrated in FIG. 9A, the trenches GTB, GTC, GTD, and GTE are connected to each other at the respective ends thereof via the connector GTJ. Thus, even if the amount of side etching WS of the conductive layer $50f$ increases, or even if a deviation due to the misalignment of the etching mask 105 increases, the third electrode 50 provided in each of the trenches GTB, GTC, and GTD is connected to the first wiring $30cp$ via at least the third electrode 50 in the trench GTE.

Further, in an example illustrated in FIG. 9B, the end of the trench GTB and the end of the trench GTE are connected to each other via the connector GTJ. Thus, the third electrode 50 in the trench GTB is connected to the first wiring $30cp$ via the third electrode 50 in the trench GTE. In this manner, the end of the trench GTB may be connected to the end of any one of the trenches GTC, GTD and GTE via the connector GTJ.

Figure 10A:
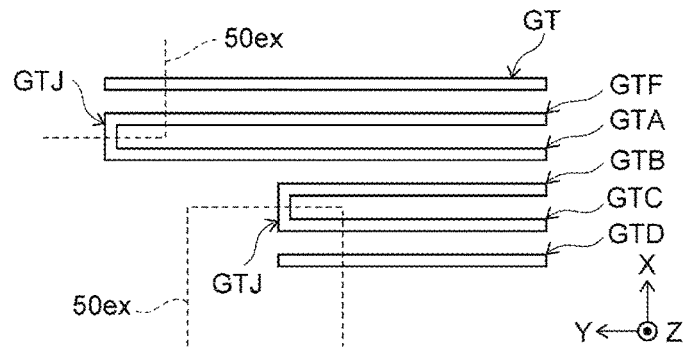
FIG. 10A to FIG. 10C are schematic views illustrating a semiconductor device according to an embodiment.
Figure 10B:
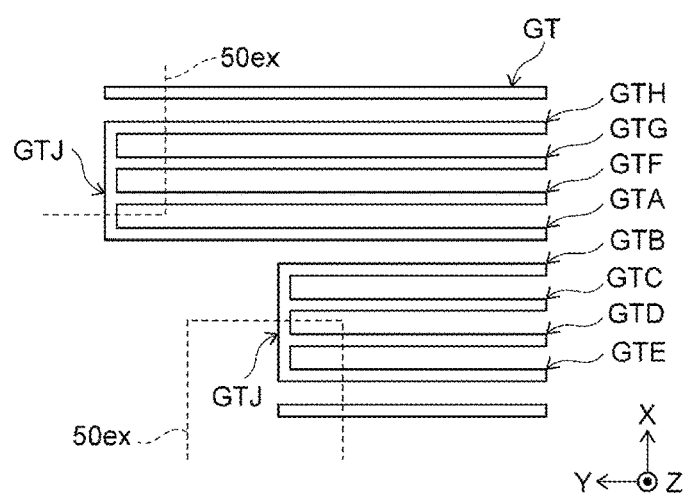
Figure 10C:
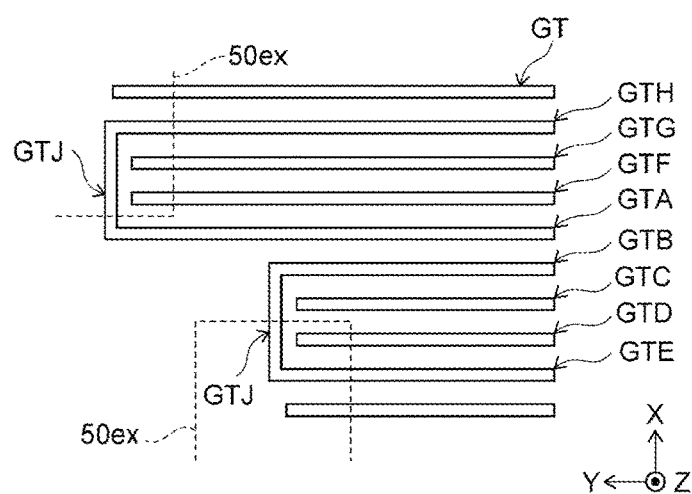

FIGS. 10A to 10C are schematic views illustrating the semiconductor device 1 according to an embodiment. FIGS. 10A to 10C are partial plan views illustrating other arrangements of the trenches GT.

As illustrated in FIG. 10A, the trench GTB and the trench GTC may be connected to each other via the connector GTJ, and adjacent trenches GTA and GTF may also be connected to each other via another connector GTJ. Such a configuration is effective, for example, when an etching mask covering the respective ends of the trenches GTB and GTC and an etching mask covering the respective ends of the trenches GTA and GTF are provided to be spaced apart from each other and a plurality of contact parts 50*ex* are spaced apart from each other. That is, even if the contact part 50*ex* which needs to be connected to the third electrodes 50 provided in the trenches GTA and GTB is removed by side etching in each etching mask, the third electrodes 50 in the trenches GTA and GTB may be connected to the first wiring 30*cp* via the third electrodes 50 provided in the trenches GTC and GTF.

In an example illustrated in FIG. 10B, the trenches GTB, GTC, GTD, and GTE are connected to each other via the connector GTJ, and the trenches GTA, GTF, GTG, and GTH are further connected to each other via another connector GTJ. Thus, the allowable range for side etching or a mask deviation due to misalignment in the etching process of the conductive layer 50*f* may be increased, so that the third electrodes 50 provided in the respective trenches may be connected to the first wiring 30*cp*.

In an example illustrated in FIG. 10C, the end of the trench GTB and the end of the trench GTE are connected to each other via the connector GTJ, and the end of the trench GTA and the end of the trench GTH are connected to each other via another connector GTJ. In this manner, the end of the trench GTB may be connected to the end of any one of the trenches GTC, GTD and GTE via the connector GTJ, and the end of the trench GTA may be connected to the end of any one of the trenches GTF, GTG and GTH.

The configurations of the trenches GT illustrated in FIGS. 9A and 9B and FIGS. 10A to 10C are applicable to the embodiments described below.

Figure 11A:
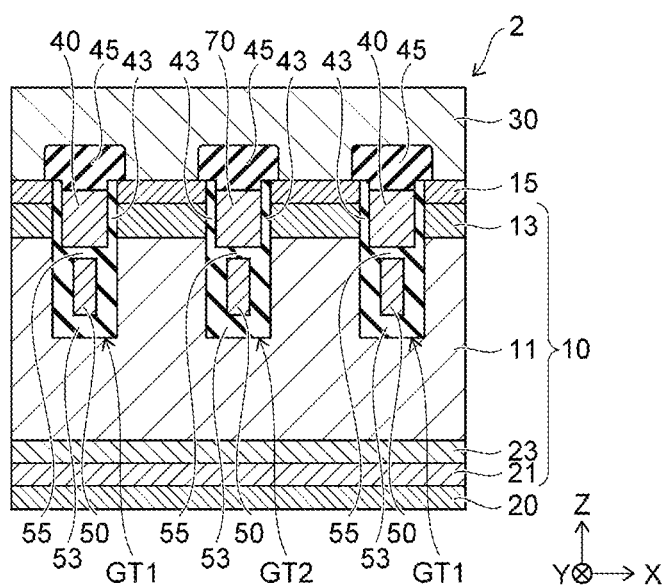
FIG. 11A and FIG. 11B are schematic views illustrating a semiconductor device according to an embodiment.
Figure 11B:
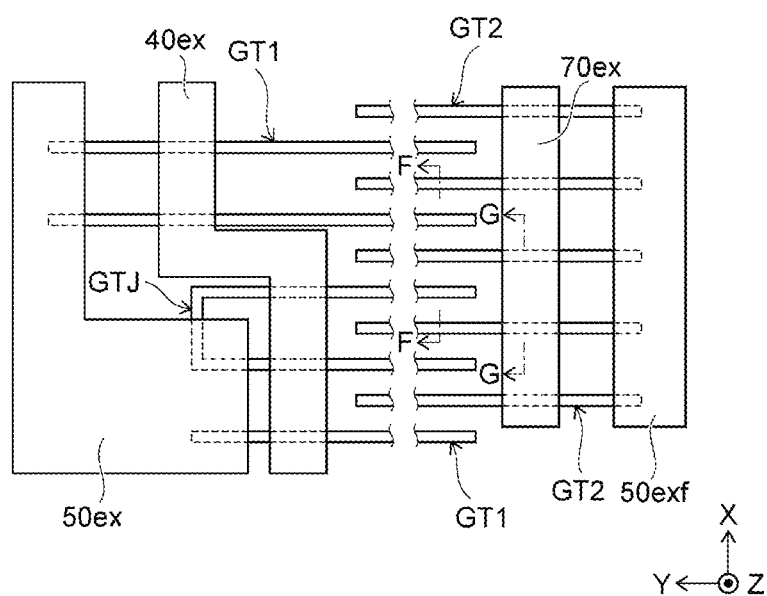

FIGS. 11A and 11B are schematic views illustrating a semiconductor device 2 according to an embodiment. FIG. 11A is a cross-sectional view taken along line F-F illustrated in FIG. 11B. FIG. 11B is a plan view illustrating the arrangement of trenches GT1 and GT2.

As illustrated in FIG. 11A, the semiconductor device 2 has trenches GT1 and GT2. The control electrode 40 and the third electrode 50 are provided inside the trench GT1. The control electrode 40 is provided between the second electrode 30 and the third electrode 50.

The trench GT2 is provided, for example, between two adjacent trenches GT1. The third electrode 50 and a fourth electrode 70 are provided inside the trench GT2.

The fourth electrode 70 is provided between the second electrode 30 and the third electrode 50. The fourth electrode 70 is electrically insulated from the semiconductor unit 10 by the insulating film 43. The fourth electrode 70 faces the second semiconductor layer 13 via the insulating film 43. Further, for example, the insulating film 45 is provided between the second electrode 30 and the fourth electrode 70. The fourth electrode 70 is separated from the third electrode 50 by the insulating film 55.

As illustrated in FIG. 11B, a plurality of trenches GT1 and a plurality of trenches GT2 are provided. The trenches GT1 and the trenches GT2 extend, for example, in the Y direction, and are alternately arranged below the second electrode 30. Two adjacent trenches GT1 among the plurality of trenches GT1 are connected to each other by the connector GTJ.

The plurality of trenches GT1 are arranged side by side in the X direction. The contact part 50*ex* is provided at the Y directional end of the trench GT1. The third electrodes 50 provided inside the respective trenches GT1 is electrically connected to the first wiring 30*cp* via the contact part 50*ex* (see FIG. 3B). The plurality of trenches GT1 include the two trenches GT1 connected to each other by the connector GTJ. The connector GTJ connects the trench GT1 in which the contact part 50*ex* is not provided to the trench GT1 adjacent thereto in which the contact part 50*ex* is provided among the plurality of trenches GT1.

The contact part 40*ex* extends in the X direction across the plurality of trenches GT1. The contact part 40*ex* is shared by the control electrodes 40 provided in the respective trenches GT1. The control electrodes 40 are electrically connected to the second wiring 60*cp* via the contact part 40*ex* (see FIGS. 3A and 3B).

The plurality of trenches GT2 are arranged side by side in the X direction. A contact part 50*exf* is provided at the end in the −Y direction (i.e., opposite to the Y direction) of the trench GT2. The contact part 50*exf* is connected to the third electrodes 50 provided in the respective trenches GT2.

The semiconductor device 2 further includes a contact part 70*ex*. The contact part 70*ex* extends in the X direction across the plurality of trenches GT2. The contact part 70*ex* is shared by the fourth electrodes 70 provided in the respective trenches GT2 (see FIG. 12A).

Figure 12A:
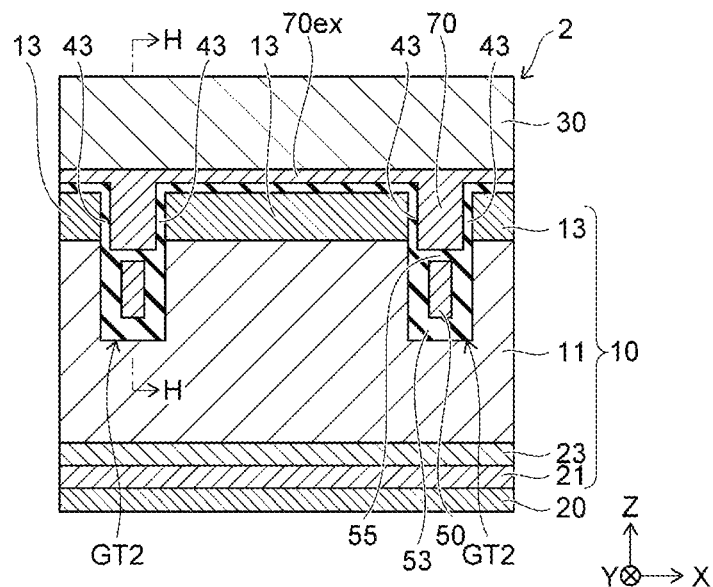
FIG. 12A and FIG. 12B are schematic cross-sectional views illustrating a semiconductor device according to an embodiment.
Figure 12B:
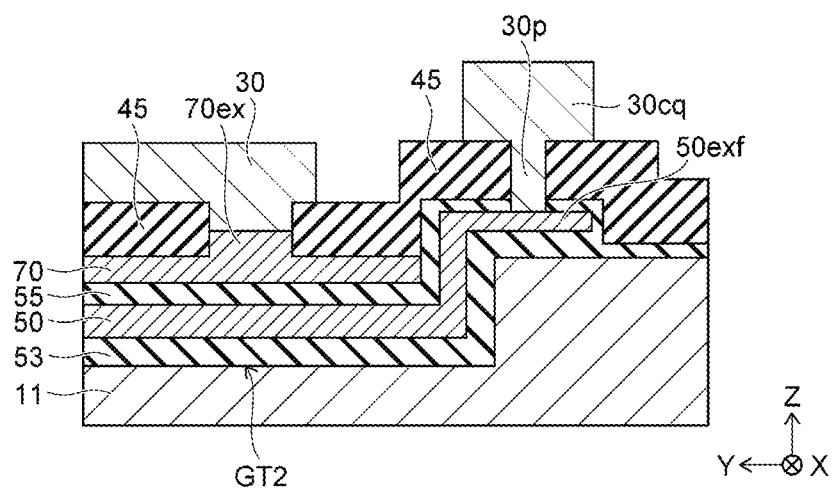

FIGS. 12A and 12B are schematic cross-sectional views illustrating the semiconductor device 2 according to an embodiment. FIG. 12A is a cross-sectional view taken along line G-G illustrated in FIG. 11B. FIG. 12B is a cross-sectional view taken along line H-H illustrated in FIG. 12A.

As illustrated in FIG. 12A, the contact part 70*ex* extends in the X direction and is connected to a plurality of fourth electrodes 70. The contact part 70*ex* is provided between the semiconductor unit 10 and the second electrode 30. The contact part 70*ex* is electrically insulated from the semiconductor unit 10 by the insulating film 43. Further, for example, the contact part 70*ex* is in contact with the second electrode 30 and is electrically connected to the second electrode 30. That is, the fourth electrode 70 is electrically connected to the second electrode 30 via the contact part 70*ex*.

For example, the second semiconductor layer 13 is provided between the first semiconductor layer 11 of the semiconductor unit 10 and the contact part 70*ex*. The second semiconductor layer 13 is provided between two adjacent trenches GT2 so as to face the fourth electrode 70 across the insulating film 43. Further, for example, the third semiconductor layer 15 is not provided between the second semiconductor layer 13 and the contact part 70*ex*.

As illustrated in FIG. 12B, the fourth electrode 70 extends in the Y direction inside the trench GT2. The fourth electrode 70 is electrically connected to the second electrode 30 via the contact part 70*ex*.

The third electrode 50 is elongated in the Z direction at the −Y directional end thereof and is connected to the contact part 50*exf*. The third electrode 50 has a portion located between the −Y directional end of the trench GT2 and the fourth electrode 70. The first wiring 30*cq* has the contact plug 30*p* stretched through the insulating film 45 and the insulating film 55 and connected to the contact part 50*exf*. That is, the third electrode 50 in the trench GT2 is electrically connected to the first wiring 30*cq* via the contact part 50*exf* and the contact plug 30*p*.

In an embodiment, the fourth electrode 70 is formed at the same time with the control electrode 40. Further, the contact part 70*ex* is formed together with the contact part 40*ex* in the process of forming the control electrode 40 and the fourth electrode 70 respectively in the trench GT1 and the trench GT2 (see FIG. 6C).

The fourth electrode 70 and the contact parts 40*ex* and 70*ex* are, for example, conductive polysilicon. The contact part 40*ex* also extends above the semiconductor unit 10 and is electrically insulated from the semiconductor unit 10 by the insulating film 43 in the same manner as the contact part 70*ex* (see FIG. 12A).

Figure 13A:
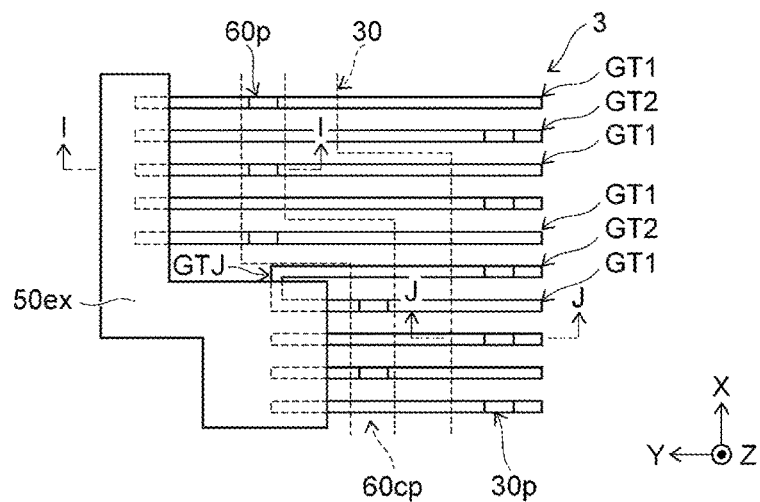
FIG. 13A to FIG. 13C are schematic views illustrating a semiconductor device according to an embodiment.
Figure 13B:
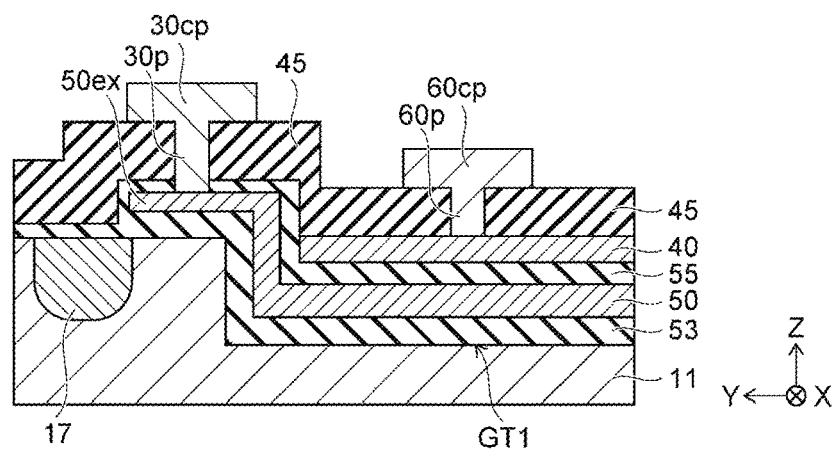
Figure 13C:
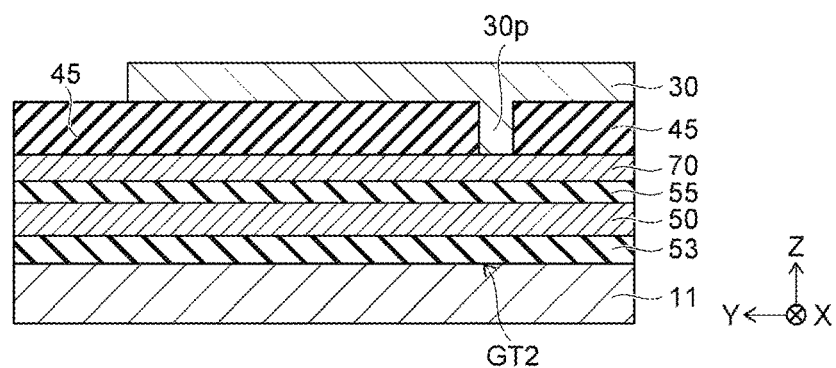

FIGS. 13A to 13C are schematic views illustrating a semiconductor device 3 according to an embodiment. FIG. 13A is a plan view illustrating the arrangement of the trenches GT1 and the trenches GT2. FIG. 13B is a cross-sectional view taken along line I-I illustrated in FIG. 13A. FIG. 13C is a cross-sectional view taken along line J-J illustrated in FIG. 13A.

As illustrated in FIG. 13A, a plurality of trenches GT1 and a plurality of trenches GT2 are alternately arranged in the X direction. In this example, adjacent trenches GT1 and the GT2 are connected to each other via the connector GTJ. For example, the connector GTJ connects the trench GT2 in which the contact part 50*ex* is not provided, among the plurality of trenches GT2, to the trench GT1 adjacent thereto.

The contact part 50*ex* is provided at the Y directional ends of the trenches GT1 and the trenches GT2. Further, the other contact part may be provided at the −Y directional ends of the trenches GT1 and the trenches GT2. In this example, the contact part 40*ex* and the contact part 70*ex* are not provided (see FIG. 11B).

As illustrated in FIG. 13B, the control electrode 40 is electrically connected to the second wiring 60*cp* via the contact plug 60*p*. The contact plug 60*p* is elongated from the second wiring 60*cp* into the insulating film 45, and is directly connected to the control electrode 40 provided in the trench GT1.

As illustrated in FIG. 13C, the fourth electrode 70 is electrically connected to the second electrode 30 via the contact plug 30*p*. The contact plug 30*p* is elongated from the second electrode 30 into the insulating film 45 and is directly connected to the fourth electrode 70 provided in the trench GT2.

Figure 14A:
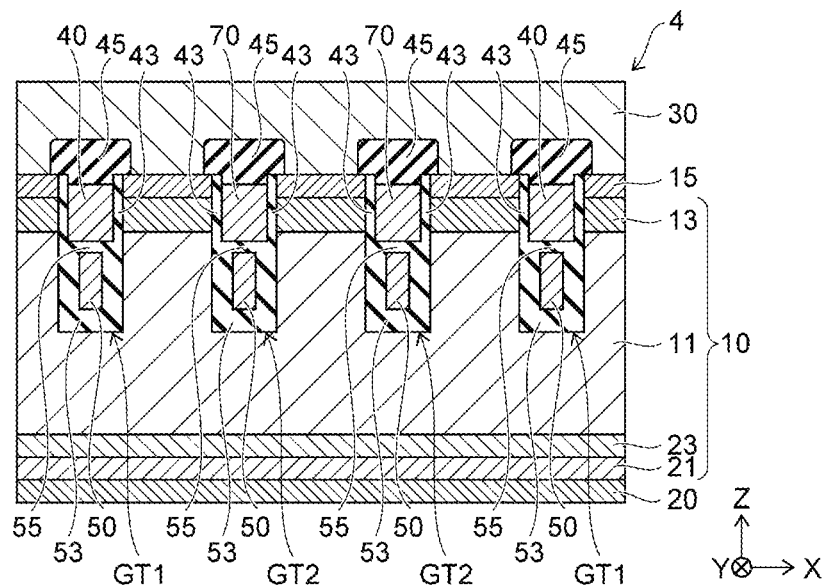
FIG. 14A and FIG. 14B are schematic views illustrating a semiconductor device according to an embodiment.
Figure 14B:
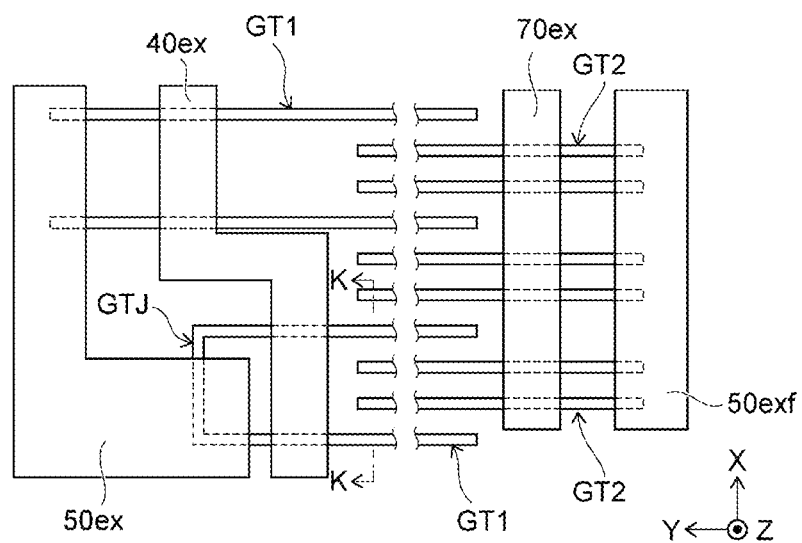

FIGS. 14A and 14B are schematic views illustrating a semiconductor device 4 according to an embodiment. FIG. 14A is a cross-sectional view taken along line K-K illustrated in FIG. 14B. FIG. 14B is a plan view illustrating the arrangement of the trenches GT1 and GT2.

As illustrated in FIG. 14A, the semiconductor device 4 includes the trenches GT1 and the trenches GT2. The control electrode 40 and the third electrode 50 are provided inside each of the trenches GT1. The fourth electrode 70 and the third electrode 50 are provided inside each of the trenches GT2. In this example, two trenches GT2 are provided between two adjacent trenches GT1.

As illustrated in FIG. 14B, a plurality of trenches GT1 and a plurality of trenches GT2 are provided, and are arranged side by side in the X direction. Two trenches GT2 are arranged between adjacent trenches GT1. Two adjacent trenches GT1 among the plurality of trenches GT1 are connected to each other by the connector GTJ.

The contact part 50*ex* is provided at the Y directional end of the trenches GT1. The third electrode 50 provided in each of the trenches GT1 is electrically connected to the first wiring 30*cp* via the contact part 50*ex* (see FIG. 3B). The connector GTJ connects the trench GT1 in which the contact part 50*ex* is not provided, among the plurality of trenches GT1, to the trench GT1 adjacent thereto. Further, the control electrode 40 provided inside the trench GT1 is electrically connected to the second wiring 60*cp* via the contact part 40*ex* (see FIG. 3B).

The contact part 50*exf* is provided at the −Y directional end of the trenches GT2. The third electrode 50 provided in each of the trenches GT2 is electrically connected to the first wiring 30*cq* via the contact part 50*exf* (see FIG. 12B). Further, the fourth electrode 70 provided inside the trench GT2 is electrically connected to the second electrode 30 via the contact part 70*ex* (see FIG. 12B).

As described above, in each semiconductor device according to the aforementioned embodiments, the trench GT including the third electrode 50 which is not connected to the contact part 50*ex* among the plurality of trenches GT is connected to the trench GT adjacent thereto. Thus, the third electrodes 50 of the two trenches are connected to each other, which allows a plurality of third electrodes 50 to be surely connected to the first wiring 30*cp*. As a result, the semiconductor device may be operated stably.

The embodiments are not limited to the above description, and for example, in the arrangement of the trenches GT1 and GT2 illustrated in FIGS. 11B and 14B, the trench GT1 may be elongated in the −Y direction, the trench GT2 may be elongated in the Y direction, and each third electrode 50 may connected to both the contact parts 50*ex* and 50*exf*.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a semiconductor layer having a first surface in which a plurality of trenches each extending along a first surface direction are arranged along a second surface direction perpendicular to the first surface direction;
    a first electrode on a second surface of the semiconductor layer;
    a second electrode on the first surface of the semiconductor layer;
    a control electrode inside one or more of the trenches;
    a third electrode inside each of the trenches, the control electrode being inside each of the trenches between the second and third electrodes;
    a first wiring extending along the second surface direction above the first surface of the semiconductor layer at an end in the first surface direction of each of the trenches, and electrically connected to the second electrode and the third electrode in each of the trenches; and
    a first contact provided between the semiconductor layer and the first wiring, the first wiring and the third electrode in two or more of the trenches being electrically connected via the first contact, wherein
    the plurality of trenches includes first, second, and third trenches,
    the first and second trenches are connected to each other via a first connector trench that is provided at an end in the first surface direction of each of the first and second trenches and extends in the second surface direction, and
    the third trench extends beyond the end of each of the first and second trenches along the first surface direction.

2. The semiconductor device according to claim 1,
    the third electrodes inside each of the first and second trenches are connected by portions of the third electrodes through the first connector trench.

3. The semiconductor device according to claim 2, wherein
the semiconductor layer includes a first conductivity type first semiconductor layer, a second conductivity type second semiconductor layer, and a first conductivity type third semiconductor layer,
the third electrode is electrically insulated from the first semiconductor layer by a first insulating film, and
the control electrode is electrically insulated from:
the second and third semiconductor layers by a second insulating film,
the third electrode by a third insulating film, and
the second electrode by a fourth insulating film.

4. The semiconductor device according to claim 3, wherein the second electrode contacts the fourth insulating film and the third semiconductor layer.

5. The semiconductor device according to claim 3, wherein the first conductivity type is n-type, and the second conductivity type is p-type.

6. The semiconductor device according to claim 2, wherein the third electrode is electrically connected to the second electrode.

7. The semiconductor device according to claim 1, further comprising:
a second wiring extending along the second surface direction above the first surface of the semiconductor layer between the first wiring and the second electrode and electrically connected to the control electrode.

8. The semiconductor device according to claim 1, wherein
the semiconductor layer includes a second conductivity type semiconductor layer surrounding the first, second, and third trenches and having an outer edge including a first side extending along the first surface direction, a second side extending along the second surface direction, and a corner connecting the first and second sides, and
the end of each of the first and second trenches is provided at the corner of the outer edge.

9. The semiconductor device according to claim 1, wherein the first connector trench is directly connected to the first trench and the second trench.

10. The semiconductor device according to claim 2, wherein an upper surface of the third electrode in the first connector trench is closer to the first surface than a bottom surface of the control electrode in the first trench.

11. The semiconductor device according to claim 1, further comprising:
a contact portion extending along the first surface direction at a level above the third electrode and electrically connected to the third electrode,
wherein the first contact is in contact with an upper surface of the contact portion.

12. The semiconductor device according to claim 11, wherein the contact portion is above the first surface of the semiconductor layer.

13. The semiconductor device according to claim 11, wherein the contact portion and the third electrode in the second trench are aligned in the first surface direction.

14. The semiconductor device according to claim 1, wherein the first wiring and the third electrode in each of the first and second trenches are electrically connected via the first contact.

* * * * *